United States Patent [19]

Ishii et al.

[11] Patent Number: 4,463,366

[45] Date of Patent: Jul. 31, 1984

[54] FIELD EFFECT TRANSISTOR WITH COMBINATION SCHOTTKY-JUNCTION GATE

[75] Inventors: Yasunobu Ishii, Tokyo; Kazuyoshi Asai, Iruma; Katsuhiko Kurumada, Tokyo, all of Japan

[73] Assignee: Nippon Telegraph & Telephone Public Corp., Chiyoda, Japan

[21] Appl. No.: 161,630

[22] Filed: Jun. 20, 1980

[51] Int. Cl.³ .................. H01L 29/80; H01L 29/48; H01L 29/06; H01L 29/161
[52] U.S. Cl. ...................... 357/22; 357/15; 357/20; 357/61; 357/91; 357/86
[58] Field of Search .............. 357/15, 22, 20, 61, 357/91, 86

[56] References Cited

U.S. PATENT DOCUMENTS

| | | | |
|---|---|---|---|
| 2,869,054 | 1/1959 | Tucker | 357/22 |
| 3,044,909 | 7/1962 | Shockley | 357/22 |
| 4,297,718 | 10/1981 | Nishizawa et al. | 357/22 |
| 4,327,475 | 5/1982 | Asai et al. | 357/22 |

FOREIGN PATENT DOCUMENTS

| | | | |
|---|---|---|---|
| 46-32698 | 9/1971 | Japan | 357/22 S |
| 52-73681 | 6/1977 | Japan | 357/22 G |
| 55-141760 | 11/1980 | Japan | 357/22 G |

OTHER PUBLICATIONS

Solid State Electronics, 1975, vol. 18, pp. 349-353, Hunsperger et al.
Journal of Applied Physics, vol. 45, No. 8, Aug. 1974, Welch et al.
IEEE Transaction Microwave Theory and Techniques, vol. MTT-24, No. 6, Jun. 1976, Liechti.
IBM-Technical Disclosure Bulletin, vol. 14, No. 9, Feb. 1972 Remshardt et al.

*Primary Examiner*—Edward J. Wojciechowicz
*Assistant Examiner*—John Lamont
*Attorney, Agent, or Firm*—Townsend and Townsend

[57] ABSTRACT

A field effect transistor device is constituted by a semiinsulating substrate consisting of a compound semiconductor, an N type semiconductor layer formed on the substrate, a plurality of P type semiconductor gate regions aligned along a straight line and extending through the semiconductor layer to reach the substrate, source and drain electrodes disposed on the semiconductor layer on the opposite sides of the drain regions, a gate electrode having an ohmic contact with the gate regions and having a Schottky contact with the semiconductor layer interposed between the gate regions. Two gate regions on the opposite ends of the array are in contact with the boundary region of the transistor.

The field effect transistor device is useful for fabricating an integrated circuit and consumes less electric power. Further it reduces dispersion in the gate pinch off voltage and can be prepared at a high yield.

3 Claims, 11 Drawing Figures

FIELD EFFECT TRANSISTOR WITH COMBINATION SCHOTTKY-JUNCTION GATE

BACKGROUND OF THE INVENTION

This invention relates to a field effect transistor, more particularly a field effect transistor device in which function regions which constitute the field effect transistor are disposed in a compound semiconductor layer on a semiinsulating substrate made of a similar compound semiconductor and a method of manufacturing such transistor.

An ordinary field effect transistor now being used widely is constructed such that an N type semiconductor layer made of such compound semiconductor as GaAs is epitaxially grown on a semiinsulating substrate made of the similar compound semiconductor. A source electrode and a drain electrode having a predetermined spacing are attached to the surface of the semiconductor layer with ohmic contacts and a gate electrode in a Schottky barrier junction with the semiconductor layer is disposed between the source and drain electrodes. Such a construction is disclosed in a Charles A. Liechti's paper entitled "Microwave Field-Effect Transistor 1976", I.E.E.E. Transaction on Microwave Theory and Techniques, Vol. MTT-24, No. 6 pages 279–300, June, 1976.

In a transistor of this construction, a depletion layer extends into the semiconductor layer from the Schottky junction according to the magnitude of a control voltage impressed across the gate and source electrodes so that the cross-sectional area of a drain current path in the semiconductor layer is narrowed in accordance with the gate control voltage.

Moreover, the transistor constructed as above described involves the following problems.

Firstly, as the semiconductor layer is epitaxially grown on the semiinsulating substrate, in most cases, portions of the semiconductor layer near the substrate have crystal defects. In addition, since these portions are formed at the initial stage of epitaxial growth, the impurity concentration is difficult to make uniform due to manufacturing technique. For this reason it is extremely difficult to make uniform the characteristics of the transistor at or near cutting off the drain current (gate pinch off) regardless of an accurate control of the thickness of the semiconductor layer as the subsequent process for manufacturing steps of the transistor. Thus, this problem is one of the factors that decreases the yield of satisfactory transistors. This is more particularly true in transistors assembled into an integrated circuit. For example, it is desired to ON/OFF control the drain current with relatively small gate control voltage of about ±1 volt, the thickness of the semiconductor layer becomes about 0.1 to 0.15 micron for $1 \times 10^{17}$ through $5 \times 10^{16}$ cm$^{-3}$ of N type impurity concentration in GaAs so that the problem caused by the construction described above results in a large dispersion in the gate pinch off voltage.

For this reason, it is difficult to assemble transistors into an integrated circuit for commerical use.

Furthermore, the transistor of this type is manufactured by the steps of forming a semiconductive layer of one conductivity type by implanting ions of an impurity into one surface of a semiinsulating substrate made of such compound as GaAs, forming source and drain electrodes in an ohmic contact with the surface of the substrate, and then forming a gate electrode to form a Schottky junction. Transistors prepared by this method are disclosed in a B. W. Welch et al paper entitled "Gallium Arsenide Field Effect Transistor by Ion Implantation", Journal of Applied Physics, vol. 45, No. 8, pages 3685–3687, Aug. 1974 and a R. G. Hunsperger et al paper entitled "Ion-Implanted Microwave Field Effect Transistors in GaAs", Solid State Electronics, Vol. 18, pages 349–352.

With the transistor of the construction described above, for the purpose of recovering distorted crystal structure caused by the implanted ions which are implanted into the semiconductor substrate for forming the semiconductor layer and of electrically activating the implanted ions of an impurity it is necessary to subject the implanted substrate to an annealing treatment in which the substrate is heated to a high temperature of 800° to 900° C. However, such annealing treatment accompanies the following problem. More particularly, such residual impurities as chromium, silicon, etc. contained in the substrate at the time of preparing the semiinsulating semiconductor substrate tend to diffuse or unwanted external impurities might be incorporated, or impurities implanted into a predetermined portion at a predetermined concentration tend to diffuse. In addition, when the surface of the semiinsulating semiconductor substrate is subjected to the high temperature described above, such surface of compound semiconductor as GaAs often decomposes. Due to various phenomena appearing at the time of annealing it is difficult to obtain at a high reproducibility a semiconductor having a uniform thickness and containing an impurity at a uniform concentration. This also causes dispersion in the pinch off voltage of the resulting transistor thus decreasing the yield.

SUMMARY OF THE INVENTION

Accordingly, it is a principal object of this invention to provide a field effect transistor and a method of manufacturing the same at a high yield which is suitable to assemble an integrated circuit.

Another object of this invention is to provide a field effect transistor device and a method of manufacturing the same capable of reducing dispersion in the gate pinch off voltage.

Still another object of this invention is to provide an improved field effect transistor device suitable for use in a logic circuit consuming only a little electric power.

A further object of this invention is to provide an improved field effect transistor device and a method of manufacturing the same capable of determining the size of a channel to be formed according to the accuracy of a mask utilized at the time of manufacturing the transistor device and having a uniform characteristic and can be manufactured at a higher yield than the prior art field effect transistors.

A still further object of this invention is to provide a field effect transistor device and a method of manufacturing the same capable of having excellent characteristics not affected by the crystal quality of a compound semiconductor layer formed by growing on a semiinsulating compound semiconductor substrate.

Yet another object of this invention is to provide a field effect transistor device and a method of manufacturing the same having characteristics not affected by various factors cause by a high temperature annealing treatment utilized at a time when an N type semiconductor layer is formed in a semiinsulating substrate by N type ion implantation technique.

According to this invention, these and other objects can be accomplished by providing a field effect transistor comprising a semiinsulating layer made of a compound semiconductor, a compound semiconductor layer of a first conductivity type which is disposed on said semiinsulating layer, at least two semiconductor gate regions of a second conductivity type different from the first conductivity type which extend from a main surface of the semiconductor layer substantially to said semiinsulating layer and which are spaced apart from each other, source and drain electrodes arranged at both sides of said semiconductor regions to have an ohmic contact therewith, and a gate electrode means which has an ohmic contact with said semiconductor gate regions and which further has a Schottky contact with the semiconductor layer interposed between the semiconductor gate regions, a periphery of a resulting transistor being in contact with at least two of said semiconductor gate regions.

According to this invention, these and other objects can be accomplished by providing a method of manufacturing a field effect transistor comprising the steps of forming a semiinsulating layer made of compound semiconductor and a first conductivity type compound semiconductor layer disposed on said semiinsulating layer, forming at least two semiconductor gate regions of a second conductivity type different from the first conductivity type which extend from the main surface of said compound semiconductor layer substantially to said semiinsulating layer and which are spaced from each other by implanting an impurity of the type different from the first conductivity type from above the main surface, and forming gate, source and drain electrodes at both sides of said semiconductor gate regions as well as on said semiconductor gate regions by applying metal layers which are in an ohmic contact therewith. The second step includes a process for locating said at least two semiconductor gate regions so as to be in contact with a periphery of a resulting transistor and the third step includes a process for applying the metal layer to be used as the gate electrode so as to be in an ohmic contact with the semiconductor gate regions and further in a Schottky contact with the semiconductor layer interposed between the semiconductor gate regions.

DESCRIPTION OF THE PREFERRED EMBODIMENTS

Figure 1:
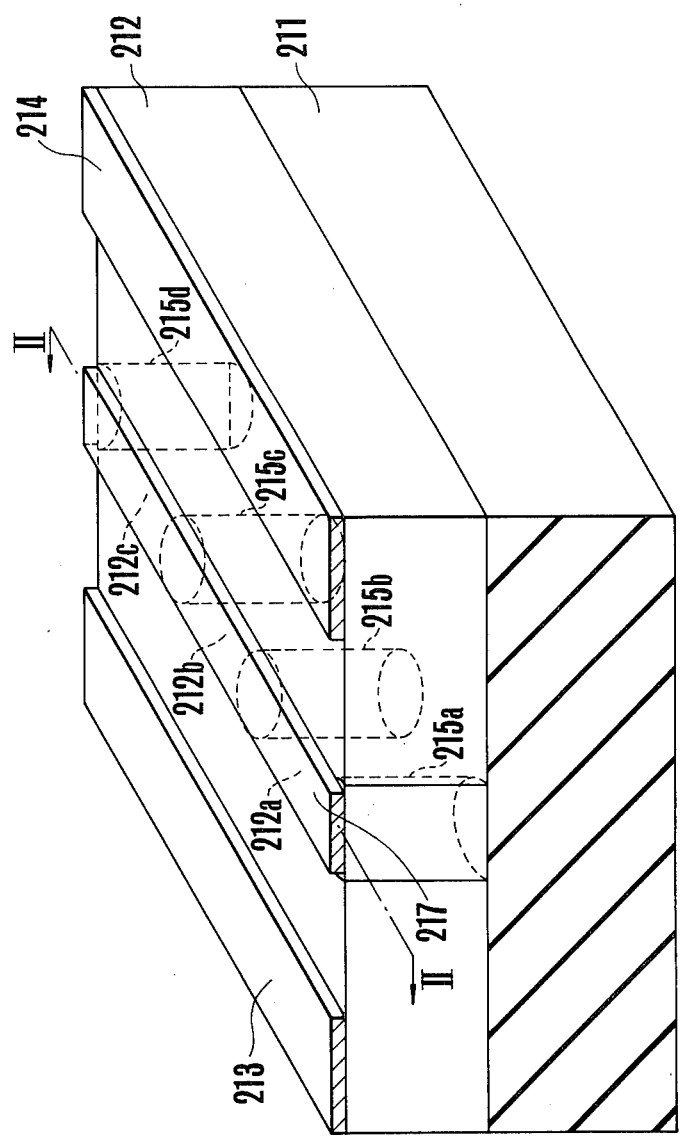
FIG. 1 is a perspective view showing one embodiment of a field effect transistor device embodying the invention.
Figure 2:
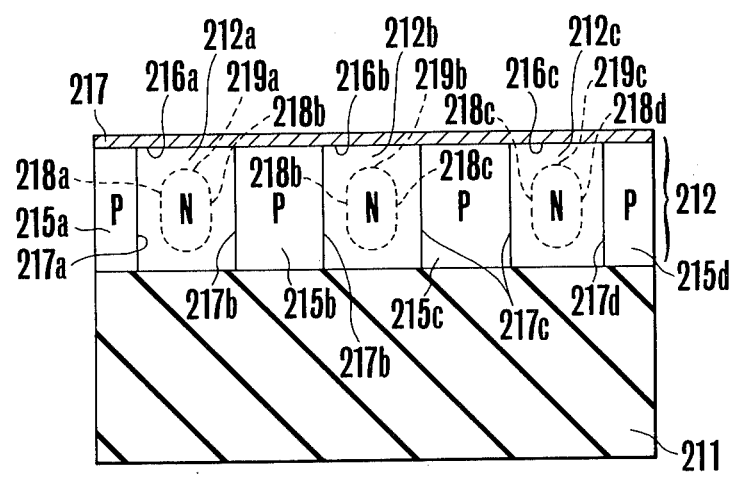
FIG. 2 is a cross-sectional view taken along a line II—II shown in FIG. 1.

FIGS. 1 and 2 show a preferred embodiment of the field effect transistor device according to the present invention. In the drawings, the semiconductor substrate 211 is made of such compound as GaAs or InP. The substrate 211 has a thickness of about 300 microns and high specific resistivity of $10^6$ ohm cm or more. On the substrate 211 is formed an N type compound semiconductor layer 212 made, for instance, of GaAs or InP, by expitaxial growth. The semiconductor layer 212 has an impurity concentration of $5 \times 10^{16}$ atoms/cm$^3$, for instance, and a thickness of 0.1 to 1 micron. On the main surface of the semiconductor layer 212 there are arranged metal layers 213 and 214 comprising gold-tin and gold-germanium or the like in parallel with a suitable spacing of, for instance, 5–10 microns to form source and drain electrodes. These metal layers 213 and 214 here are arranged so as to be in an ohmic contact with the semiconductor layer 212.

A plurality of P type semiconductor gate regions 215a, 215b, 215c and 215d are formed in the semiconductor layer 212 along a straight line at about the center between the metal layers 213 and 214 and extending in parallel thereto and with a spacing of, for instance, 4 microns, the impurity concentration thereof being 1 to $20 \times 10^{18}$ atoms/cm$^3$. These semiconductor gate regions 215a through 215d are formed by implanting ions of Be, Cd or Zn into the semiconductor layer 212 and have a substantially circular cross sectional configuration, extending from the main surface of the semiconductor layer 212 either to the interface between the semiconductor layer 212 and the semiinsulating substrate 211 or more deeply into the substrate 211. A metal layer 217 made of molybdenum or chromium is arranged as a gate electrode on the gate regions 215a through 215d and on the channel regions 212a through 212c of the semiconductor layer 212 which locate in the spaces between said gate regions 215a to 215d. The metal layer 217 directly contacts with the N type semiconductor region 212a, 212b and 212c interposed between each gate regions 215a through 215d to form a Schottky barrier junction therebetween.

Figure 3:
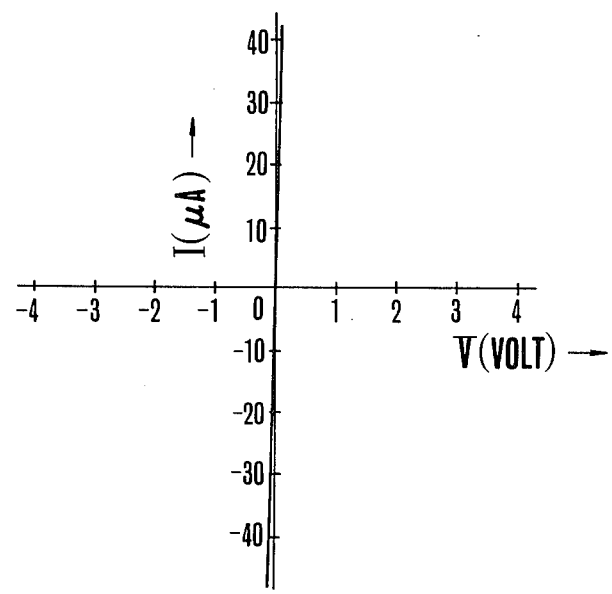
FIG. 3 is a graph showing the voltage-current characteristic obtained when electrodes are formed on a GaAs substrate of P type.
Figure 4:
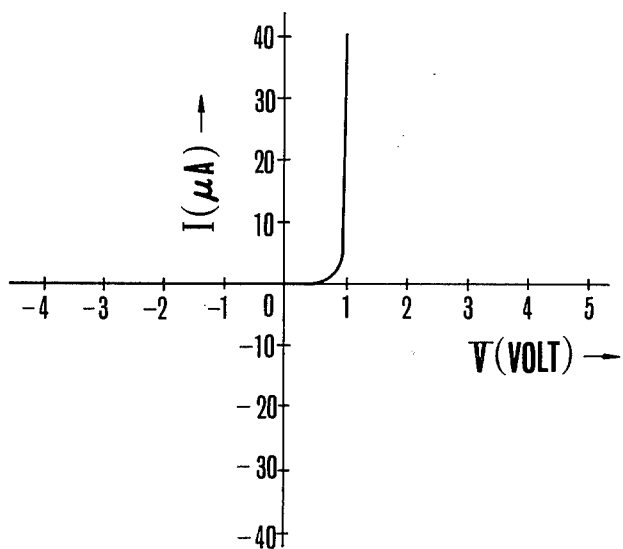
FIG. 4 is a graph showing the voltage-current characteristic detailed sectional view showing a manner obtained when electrodes are formed on a GaAs substrate of N type.

FIG. 3 is a graph of the characteristics in order to prove that when metal layers are applied on a P type semiconductor gate region, an ohmic contact is formed therebetween while FIG. 4 is a graph of the characteristics in order to prove that when metal layers are applied on an N type semiconductor layer a Schottky junction is formed therebetween.

FIG. 3 shows the voltage-current characteristics obtained by forming the first electrode made of Mo, 42 microns in diameter and of 0.2 to 1.0 micron in thickness on the P type GaAs substrate, forming the second electrode made of Mo, 52 microns in inner diameter and of 0.2 to 0.3 microns in thickness which is arranged concentric with the first circular electrode and applying a voltage between the said electrode wherein the impurity concentration on the surface of the GaAs substrate being more than about $5 \times 10^{18}$ cm$^{-3}$ and each Mo electrodes being formed by the vacuum deposition technique upon being heated at the temperature of 300 to 500° C. As shown in the linear voltage-current characteristics, when electrodes are formed on a P type GaAs substrate, an ohmic contact is formed therebetween.

FIG. 4 shows the voltage-current characteristics obtained by forming the first and second electrodes of the size similar to the one shown in FIG. 3 on an N type GaAs substrate having an impurity concentration of less than $3\times10^{17}$ cm$^{-3}$ under a condition similar to that in FIG. 3, and applying voltage therebetween. The voltage-current characteristics which are similar to a diode-characteristic indicate that a Schottky junction is formed between electrodes and an N type GaAs substrate when the electrodes are formed on the N type GaAs substrate.

The structure described above permits the semiconductor layer have the following effect in addition to the effect caused by providing a P type columnar semiconductor gate region in an N type semiconductor.

The field effect transistor constructed as above described has the following advantages.

(1) Since a plurality of semiconductor gate regions are formed through a semiconductor layer consisting of a compound semiconductor formed on a semiinsulating semiconductor layer made of similar compound from the main surface of the semiconductor layer to the semiinsulating semiconductor it is possible to obtain field effect transistors of uniform quality at a high yield, which are suitable to fabricate integrated circuits. More particularly, the depletion layers extending from the semiconductor gate regions formed substantially at right angles to the semiconductor layer 212 are formed substantially in parallel with the direction of thickness of the semiconductor layer and extend toward the opposed semiconductor gate regions. For example, the state of the depletion layer will be described in more detail with reference to FIG. 2. The depletion layer is more or less deformed at a portion of the semiconductor layer 212a close to the substrate due to crystal defects or nonuniform concentration of the impurity, and under a normal state the depletion layer extends farther than other portions because of the lower concentration of N type impurities. For this reason, these portions are connected together a little earlier than other portions. These portions are located near the substrate by a few hundred Angstroms, which is much smaller than the thickness (1 micron, for example) of the semiconductor layer 212. For this reason, regardless of a variation in the characteristics of these portions close to the substrate, the control of the drain current, that is the gate characteristic, is determined by the state of elongation of relatively uniform depletion layers at portions other than the portions close to the substrate. Thus, it is possible to obtain transistors having uniform characteristics. Furthermore, according to this invention since the depletion layers extend in the opposite directions, even when the thickness of the semiconductor layer is extremely reduced to several hundreds Angstroms, for example, for the purpose of obtaining logic transistors of a low power consumption, the gate pinch off characteristics of the transistors are not affected by the crystal defects or nonuniform concentration of the impurity in the direction of thickness. Thus, it is possible to obtain field effect transistors consuming less power than the prior art transistors.

(2) Furthermore, as it is possible to determine the width of the channel according to the space between the semiconductor gate regions, the gate control characteristic of the transistor can be determined by the accuracy of a mask utilized to form the gate regions. Moreover, as the thickness of the semiconductor layer is not predetermined for the purpose of determining the width of the channel as has been the prior art practice, it is possible to select any desired thickness for the semiconductor layer thus readily producing a field effect transistor of a desired current value.

(3) In addition, according to this invention, the semiconductor gate regions at both ends of an array of the gate regions are positioned at peripheries or boundary regions of the transistor region, so that it is possible to obtain a transistor that would not be influenced by the construction at the periphery of the transistor region.

(4) As above described since the semiconductor gate regions at both ends of the array thereof are positioned at the peripheries of the transistor region, it is possible to prevent the gate control characteristic from being affected by the side walls formed when the transistor is formed as a mesa type.

(5) In addition, by positioning the semiconductor gate regions at the peripheries of the transistor region, even when the accuracy of positioning a mask utilized to form the peripheries of the transistor may decrease more or less, it is possible to obtain at a high yield transistors having desired characteristics. This advantage can be enhanced by increasing the dimension of the semiconductor gate regions in contact with the periphery in the direction of alignment of the gate regions.

(6) The structure described above permits the semiconductor layer have the following effect in addition to the effect caused by providing P type columnar semiconductor gate regions in an N type semiconductor layer formed on a semiinsulating substrate. The metal layer 217 comprising the gate electrode is made to form a Schottky junction 216a, 216b and 216c with an N type semiconductor regions even if the metal layer 217 is applied not necessarily on the semiconductor gate regions 215a through 215d but on N type semiconductor regions 212a to 212c interposed between the P type semiconductor gate regions as well as on the N type semiconductor region surrounding each semiconductor gate regions. The junction thus formed can be utilized as a gate junction together with the columnar P-N junctions 217a, 217b, 217c and 217d formed by the columnar semiconductor gate regions and the N type semiconductor region adjacent thereto. In more detail, when a predetermined bias is applied on the gate electrode, depletion layers 218a to 218d extend from the P-N junction between the P type semiconductor gate region and the N type semiconductor region adjacent thereto in the direction parallel to the main surface and, further, depletion layers 219a to 219c extend from the Schottky junctions 216a to 216c in the direction of the thickness of the semiconductor layer 212 or the direction of the semiinsulating substrate 211. The portions of the depletion layers 218a to 218d which are closer to the substrate 211 extend before other portions thereof. Therefore, when a bias voltage is applied to form depletion regions indicated by the broken lines in FIG. 2 and, as the reverse bias voltage increases, the regions encircled by the broken lines further shrink to finally reach the cut-off condition. In other words, in the structure as shown in the embodiment, even if the semiconductor gate region is minimized, the metal layer 217 formed thereon does not require the manufacturing precision corresponding to the size of the surface of the columnar region. Accordingly, such structure can simplify the manufacturing method which is to be described below. Needless to mention, in the cases like this, the depletion layer from the Schottky junction does not necessarily reach to the semiinsulating substrate 211. The transistor structure as a whole can also be simplified because the metal layer 217 comprising the gate electrode can be incorporated into the transistor by merely putting the same upon the semiconductor layer 212 including the semiconductor gate regions.

Figure 5A:
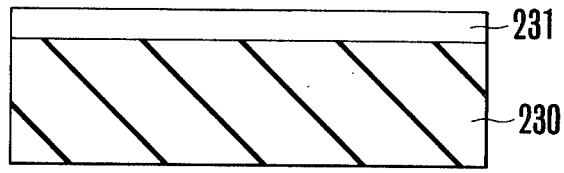
FIGS. 5A through 5F show successive steps of one method of manufacturing the transistor shown in FIG. 1.

FIGS. 5A through 5F show an embodiment of the manufacturing method of the field effect transistor device shown in FIGS. 1 and 2. First, there is prepared a semiinsulating substrate 230 comprising a compound semiconductor of GaAs or the like and with the specific resistivity of more than $10^6$ ohm.cm and the thickness of 200 to 400 microns. Then, on the main surface of the substrate 230 is formed an N type semiconductor layer 231 comprising such compound semiconductor as GaAs and of $10^{15}$ to $3 \times 10^{17}$ cm$^{-3}$ in surface impurity concentration and of 0.1 to 1 micron in thickness. In this embodiment the impurity concentration of the semiconductor layer is determined in the range so as to form a Schottky junction between the semiconductor layer and the metal layer to be placed thereupon. The semiconductor layer 231 is formed by, for instance, the epitaxial growth method, as shown in FIG. 5A.

Figure 5B:
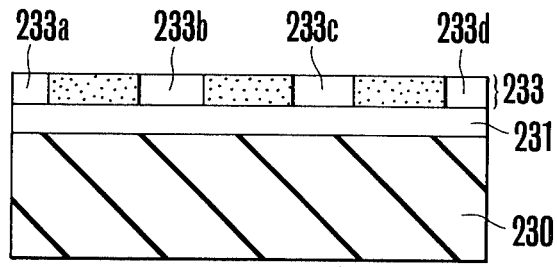

Then, a photo-resist layer 233 is formed on the said N type semiconductor layer 231 in the thickness of 0.5 to 3 microns. A plurality of windows or openings 233a to 233d are made on the photo-resist layer 233 by the photo etching method, forming a line. The openings or the windows in this embodiment have circle configurations and are arranged to be spaced uniformly, as shown in FIG. 5B.

Figure 5C:
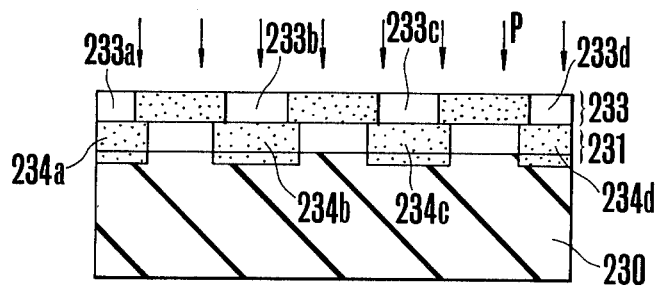

Ions of P type impurities such as Be, Zn or Cd are implanted from the direction of the arrow marked P by using the photo-resist layer 233 with the openings as a mask. In this case, the implantation may be 150 KeV and the dose of the impurities may be $5 \times 10^{14}$ cm$^{-2}$. As a result, the impurity ions are implanted into the semiconductor layer 231 and further into the upper layer of the semiinsulating substrate 230 thereunder through the openings 233a to 233d of the photo-resist layer 233 so as to form implanted regions 234a, 234b, 234c and 234d on the portions corresponding to the openings 233a through 233d, as shown in FIG. 5C. The photo-resist layer 233, then, is removed by etching using a resist remover. The substrate is subjected to an annealing processing at a low temperature of 500° to 600° C. for 20 to 60 minutes in order to activate the implanted regions 234a to 234d so as to recover the damages caused by the implantation and to make the implantation regions into P type semiconductor gate regions 235a to 235d having a surface impurity concentration of more than $5 \times 10^{18}$ cm$^{-3}$.

Figure 5D:
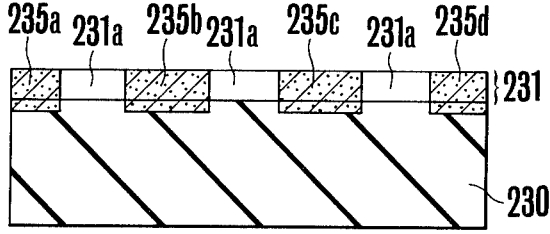

As a result, a P-N junction is formed between the P type semiconductor gate regions 235a to 235d and the rest of the layer or N type semiconductor region 231a in the semiconductor layer 231 as shown in FIG. 5D.

The surface of the semiconductor layer 231 is removed in a thickness of 10 to 100 Angstroms by slightly etching the same. The etching solution herein may be a well known mixture of sulfuric acid, hydrogen peroxide and water.

Figure 5E:
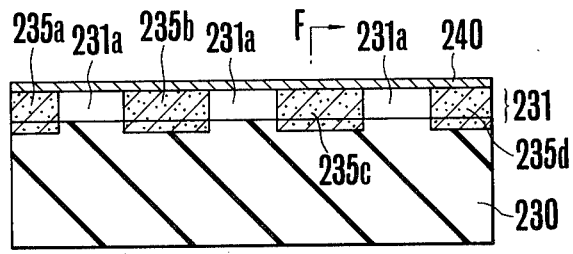

At a next stage, a metal layer in a form of the strip 240 is formed on the semiconductor gate regions 235a to 235d on the semiconductor layer 231 and on the N type semiconductor region 231a interposed between the said gate regions. The metal layer 240 is, for instance, of such metal as Mo or Cr to act as a gate electrode. The metal layer 240 is formed in the thickness of 0.1 to 1 micron by the vacuum deposition method at the temperature of 300° to 500° C. as shown in FIG. 5E.

The metal layer 240 may be deposited in the direction perpendicular to the cross section thereof extending beyond the P type semiconductor gate regions 235a to 235d.

Figure 5F:
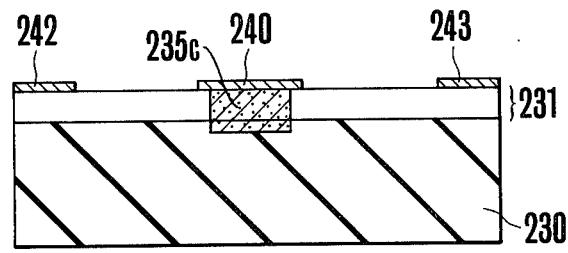

Then, metal layers 242 and 243 are formed in a manner that the metal layers are arranged at both sides of the strip metal layer 240 and spaced from the semiconductor gate regions in a suitable distance and parallel with the line direction of the semiconductor gate regions 235a to 235d, as shown in FIG. 5F. FIG. 5F shows the substrate of which cross section is shown in FIG. 5E when it is cut along the line F—F. The metal layers 242 and 243 are formed, for instance, by an Au—Ge alloy to function as source and drain electrodes for the field effect transistor which is to be formed. The metal layers 242 and 243 are deposited in the thickness of 0.1 to 0.3 microns by, for instance, a well known vacuum deposition method and then sintered for several seconds to several minutes at a temperature of 400° to 500° C. The whole configuration of the thus obtained transistor is identical with the one shown in FIG. 1.

In this embodiment, source and drain electrodes are formed after the formation of the gate electrode. Therefore, when metal layers 242 and 243 which are to form source and drain electrodes later are being formed, the manufacturing precision could be in the range which is comparatively low. It would be easily understood from this embodiment that gate electrodes might be formed after the formation of source and drain electrodes.

Figure 6:
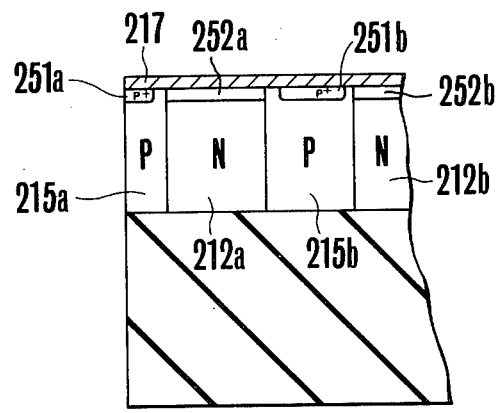
FIG. 6 is a cross sectional view showing the main parts of a modified embodiment of the field effect transistor of FIGS. 1 and 2.

In the embodiment shown in FIGS. 1 and 2, such metals as Mg, Li, Zn, Be, or Cd may be applied on the surface of each P type semiconductor gate regions 215a, 215b . . . in the manner similar to the case shown in FIG. 6 by either diffusion or implantation techniques in the formation of P+ or P++ semiconductor regions in order to secure the ohmic contact between the P type semiconductor gate regions 215a, 215b . . . and the metal layer for the gate electrode 217.

Moreover, Be or Cd ions may be implanted and then annealed on the surfaces of the N type semiconductor regions 212a, 212b . . . to form compensated N$^-$ surfaces 252a, 252b . . . shown in FIG. 6.

Further, oxygen ions or protons also may be implanted on the surfaces of the N type semiconductor regions 212a, 212b . . . In this case, the resultant surface regions 252a, 252b . . . on the N type semiconductor regions 212a, 212b . . . shown in FIG. 6 substantially insulate the gate electrode metal 217 from the N type semiconductor regions 212a, 212b . . . such that the gate control voltage may be larger than the embodiment of the Schottky barrier junction type under the forward bias condition.

The structure shown in FIG. 6 enables the metal layer for the gate electrode to be formed with an arbitrary metal.

What is claimed is:

1. A field effect transistor device comprising a semiinsulating layer made of a compound semiconductor,
   a compound semiconductor layer of a first conductivity type which is disposed on said semiinsulating layer,
   at least two semiconductor gate regions of a second conductivity type different from the first conductivity type which extend from a main surface of the semiconductor layer substantially to said semiinsulating layer and which are mutually spaced by a predetermined amount, source and drain electrodes each arranged on opposite sides of said semiconductor gate regions to have an ohmic contact with said compound semiconductor layer of first conductivity type, and a gate electrode means which has an ohmic contact with said semiconductor gate regions and which further has a Schottky contact with the semiconductor layer interposed between the semiconductor gate regions to form at least one Schottky gate region between said semiconductor gate regions, the periphery of the resulting transistor device being in contact with at least two of said semiconductor gate regions.

2. The field effect transistor device according to claim 1 wherein on a main surface of the semiconductor gate regions are formed semiconductor gate regions of a type identical with the said semiconductor gate regions but with an impurity concentration higher than the said semiconductor gate regions.

3. The field effect transistor device according to either claim 1 or 2 wherein a main surface of the semiconductor which is in a Schottky contact with said gate electrode means are formed semiconductor regions of a type identical with the semiconductor layer but with an impurity concentration lower than the semiconductor layer.

* * * * *